US007623351B2

(12) United States Patent
Moeker et al.

(10) Patent No.: US 7,623,351 B2
(45) Date of Patent: Nov. 24, 2009

(54) VALVE WITH AN INTEGRATED PC BOARD AND CONNECTING BAR

(75) Inventors: Urs T. Moeker, Littleton, CO (US); Walter A. Zub, Lone Tree, CO (US)

(73) Assignee: Norgren, Inc., Littleton, CO (US)

( * ) Notice: Subject to any disclaimer, the term of this patent is extended or adjusted under 35 U.S.C. 154(b) by 504 days.

(21) Appl. No.: 11/301,002

(22) Filed: Dec. 12, 2005

(65) Prior Publication Data

US 2007/0133154 A1 Jun. 14, 2007

(51) Int. Cl.
*H05K 5/00* (2006.01)

(52) U.S. Cl. ....................................... 361/752; 361/730

(58) Field of Classification Search ................. 361/760, 361/720

See application file for complete search history.

(56) References Cited

U.S. PATENT DOCUMENTS 4,568,899 A 2/1986 May et al.
6,587,354 B1 * 7/2003 Kutsch et al. ............... 361/788
6,705,901 B1 3/2004 Lin
6,829,214 B1 * 12/2004 Marshall ..................... 370/216
6,956,303 B1 * 10/2005 Uebelein et al. ........... 307/10.1
7,170,754 B2 * 1/2007 Asom et al. ................. 361/737
2008/0293265 A1 * 11/2008 Nguyen et al. ................ 439/74

FOREIGN PATENT DOCUMENTS

EP 1041328 A 10/2000
GB 2293054 A 3/1996
WO WO-02080329 A 10/2002

* cited by examiner

*Primary Examiner*—Hung S Bui
(74) *Attorney, Agent, or Firm*—The Ollila Group LLC

(57) ABSTRACT

A double solenoid PC board that has a long narrow section extending from the main section is disclosed. The long narrow section has a connector at the tip. The connector at the tip of the long narrow section is configured to mate with or couple to a mating connector on a single solenoid PC board in a double solenoid valve.

4 Claims, 17 Drawing Sheets

VALVE WITH AN INTEGRATED PC BOARD AND CONNECTING BAR

RELATED APPLICATIONS

This application is related to applications "A valve with a rotated solenoid", having application Ser. No. 11/301,220, "A valve island with non-active area venting between cornponents," having application Ser. No. 11/301,018, "A valve island having the expansion PC board secured in the expansion station," having application Ser. No. 11/299,874, "A valve island with a pilot air path located on the side of a sub-base," having application Ser. No. 11/301,001, now U.S. Pat. No. 7,204,273, and "An alignment ramp for a PC board in an operator for a valve", having application Ser. No. 11/301, 035, each of which was filed on the same day as this application and is incorporated herein by reference.

BACKGROUND OF THE INVENTION

1. Field of the Invention

The invention is related to the field of pneumatic controls, and in particular, to an improved valve island.

2. Description of the Prior Art

Valve islands are typically considered to be a group of electrically operated pneumatic valves mounted on a common base with a common electrical wireway. Valve islands may also be manually or pneumatically controlled. FIG. 1 is an isometric view of a typical valve island. Valve island 100 comprises a plurality of sub-bases 102, two end plates 104 and 105, with one or both end plates having multipole or fieldbus connections 106, a plurality of valves where the plurality of valves may be single solenoid valves 116 or double solenoid valves 118, the valves have a plurality of solenoids 108 attached, optional sandwich plates and base accessories 114, and a mounting bracket 112. The plurality of sub-bases 102 are joined together in a row with one of the end plates attached at each end of the row of sub-bases. The plurality of valves are mounted on top of the plurality of sub-bases 102.

One of the advantages of a valve island is that they can be expanded by incrementally adding a single or double valve stations. FIG. 2 is a partially exploded view of a typical valve island. Valve island 200 has a plurality of sub-bases 202, two end plates 204 and 205, a single add on station 203, a plurality of single solenoid valves 216, two double solenoid valves 218, screws 220, gasket 222, expansion PC board 224, a plurality of solenoids 208, and a main PC board 230 installed in the electronic raceway of the valve island 200. Screws 220 are used to couple the sub-bases together and attach the sub-bases to the end plates 204 and 205. Gasket 222 helps form a seal between the sub-bases 202 and the single add on station 203. A gasket (not shown) may also be used between single add on station 203 and end plate 205. PC board 224 is installed into electronic raceway 226 and is used to control the valve attached to the single add on station 203. Screws 228 are used to attach a valve to the single add on station 203.

FIG. 3 is an isometric view of main PC board 330 being inserted into the electronic raceway 326 of a valve island 300. Electrical connectors 332 are attached to main PC board 330 and are used to mate with or couple the main PC board 330 with the valves (not shown) attached to the top of the sub-bases 302 and 303.

Current valve islands have a number of problems. One problem is the complexity of the fluid passageways that run between and connect the various components of the valve island. The fluid passageways are difficult to manufacture and may limit the minimum size of the valve components.

Therefore there is a need for an improved valve island.

SUMMARY OF THE INVENTION

A double solenoid PC board that has a long narrow section extending from the main section is disclosed. The long narrow section has a connector at the tip. The connector at the tip of the long narrow section is configured to mate with or couple to a mating connector on a single solenoid PC board in a double solenoid valve.

DETAILED DESCRIPTION OF THE PREFERRED EMBODIMENT

FIGS. 4-17 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 4:
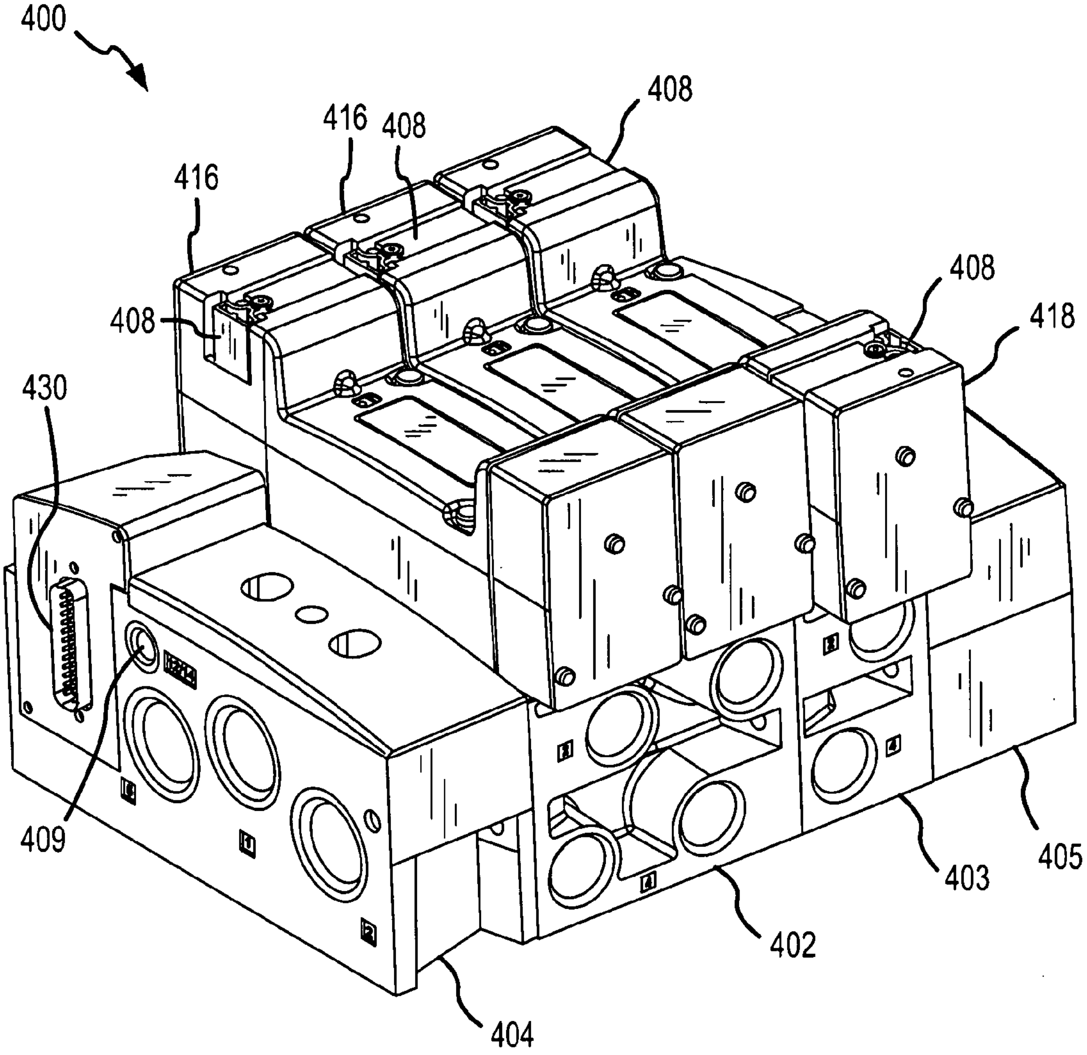
FIG. 4 is an isometric view of valve island 400 in one example embodiment of the invention.

FIG. 4 is an isometric view of valve island 400 in one example embodiment of the invention. Valve island 400 is a 3 station assembly and comprises a double sub-base 402, a single sub-base 403, end plate 405, communication end plate 404, two single solenoid valves 416, a double solenoid valve 418, a main PC board 430, pilot fluid supply port 409, and a plurality of solenoids 408. In operation, a fluid supply is coupled to the pilot port 409. The fluid may be air, gas, hydraulic fluid, or the like. In this application, the terms fluid, gas or air may be used interchangeably. The pilot port 409 runs through communication end plate 404 and couples to a pilot supply passageway in sub-base 402, sub-base 403 and end plate 405. The pilot supply can be connected at either end of the valve island or at both ends.

Figure 5:
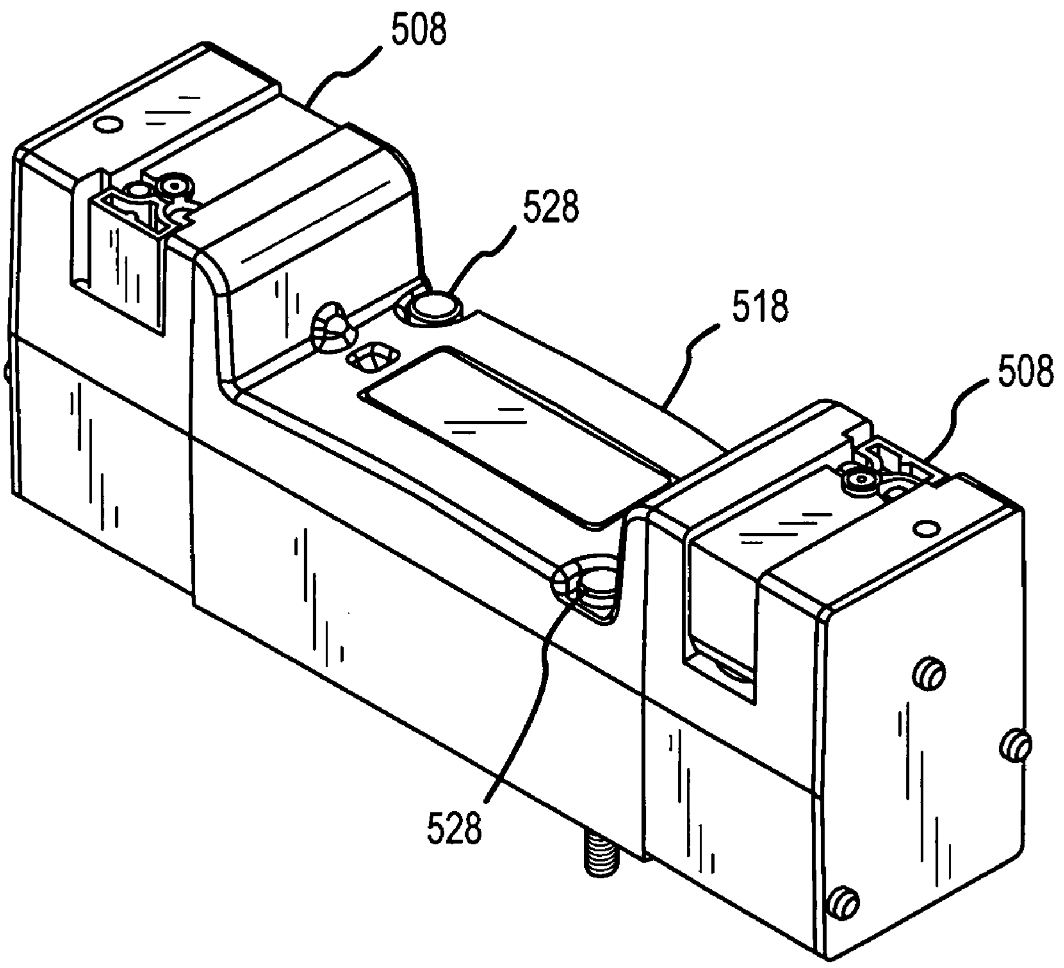
FIG. 5 is an isometric view of double solenoid valve 518 in an example embodiment of the invention.

FIG. 5 is an isometric view of double solenoid valve 518 in an example embodiment of the invention. Double solenoid valve 518 has two solenoids 508, one on either end of the valve. Screws 528 secure double solenoid valve 518 onto a sub-base (not shown). For proper operation of the valve, a pilot supply needs to be coupled to both solenoids 508. Typically pilot air for solenoid operators is provided from the main air supply or by an external air supply. Generally the external pilot air is set at a different pressure than the main air supply. In other valve island designs the external pilot air passageway typically runs along the top of the sub-base, along the bottom of the valve, or as separate pilot supply ports/passageways in the end plates and sub-bases.

Figure 6A:
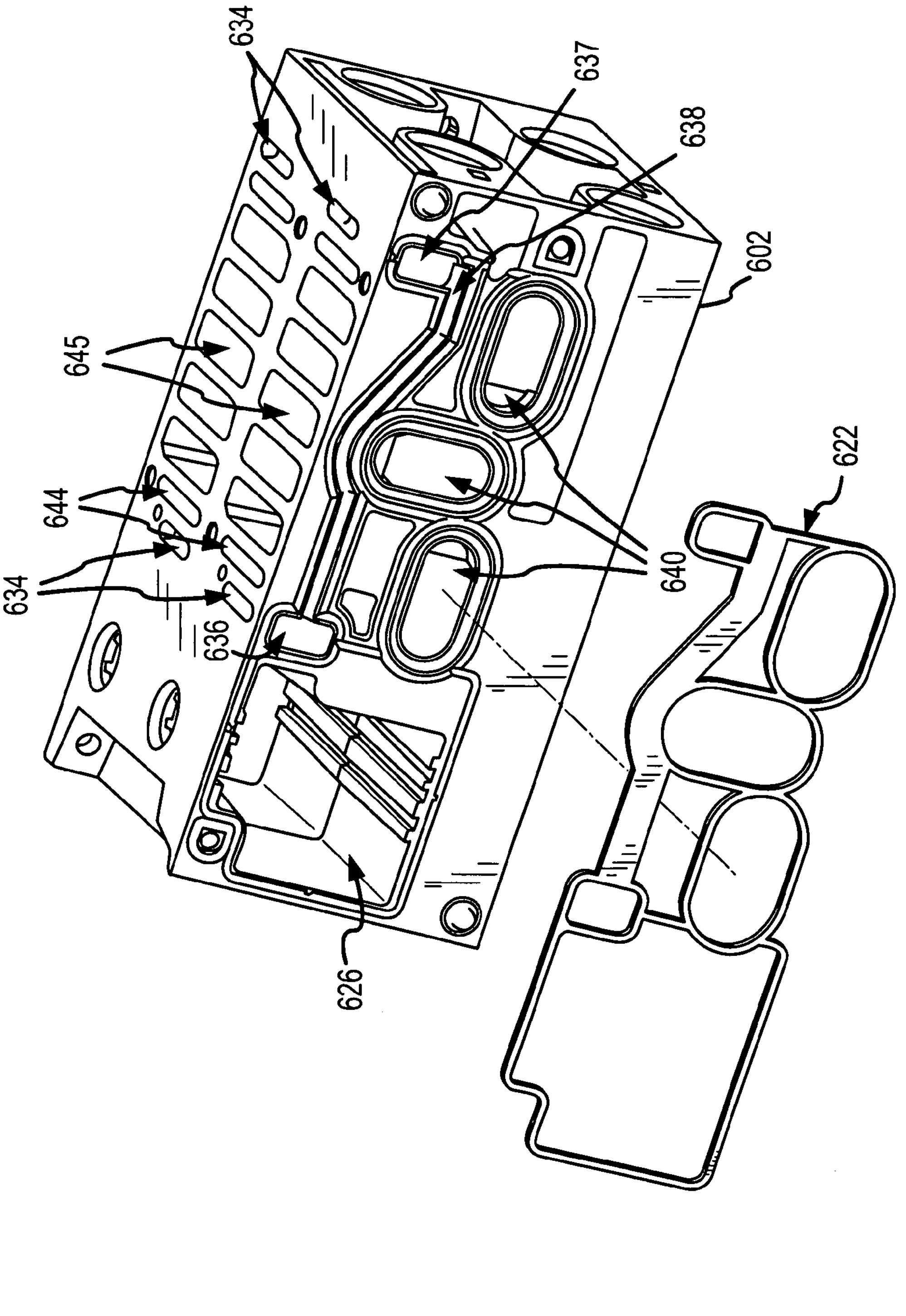
FIG. 6*a* is an isometric view of double sub-base 602 and gasket 622 in an example embodiment of the invention.

FIG. 6*a* is an isometric view of double sub-base 602 and gasket 622 in an example embodiment of the invention. Double sub-base 602 has three main air passageways 640, wireway 626, top vent openings 644, and a pilot air supply passageway that supplies pilot air to potentially four solenoids in two valves that may be mounted onto the top of sub-base 602. Part of the pilot air passageway is formed into the side of the double sub-base 602 and couples to the solenoids through the top of the sub-base. The pilot air passageway comprises four pilot air openings 634 in the top surface of double sub-base 602, a pilot air side opening 636 in the back of double sub-base 602, front pilot air side opening 637, and a pilot air channel 638 formed into one side of double sub-base 602. The pilot air side opening 636 formed in the front of double sub-base 602 extends through double sub-base 602 and exits on the opposite side of double sub-base 602. In one example embodiment of the invention, pilot air openings 634 are formed perpendicular to the top surface of the sub-base. The pilot air side opening 636 goes through double sub-base 602 and couples to the two pilot air openings 634 in the top of double sub-base 602 near the back. In one example embodiment of the invention, pilot air side opening 636 is formed perpendicular to the side of the double sub-base 602. Front pilot air side opening couples to the nearest pilot air opening in the top of double sub-base 602. In one example embodiment of the invention, front pilot air side openings 637 is formed perpendicular to the side of the double sub-base 602. Pilot air channel 638 is formed into the side of double sub-base 602 and runs between and connects pilot air side opening 636 and front pilot air side opening 637. When double sub-base 602 is assembled against another sub-base, or an end cap, the side surface of the other part forms a seal over the top of the pilot air channel 638, thereby forming part of the pilot air supply passageway.

Figure 6B:
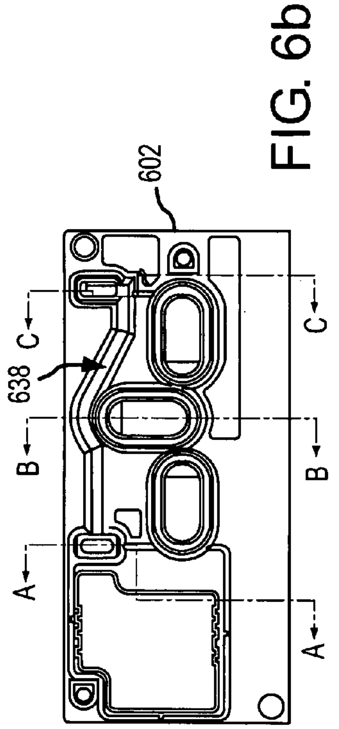
FIG. 6*b* is side view of double sub-base 602 in an example embodiment of the invention.
Figure 6C:
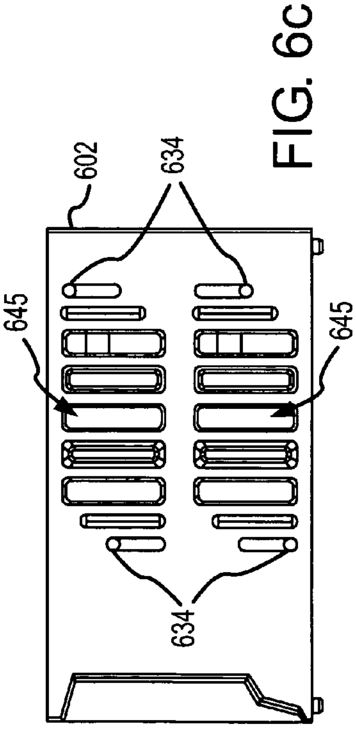
FIG. 6*c* is a top view of double sub-base 602 in an example embodiment of the invention.
Figure 6D:
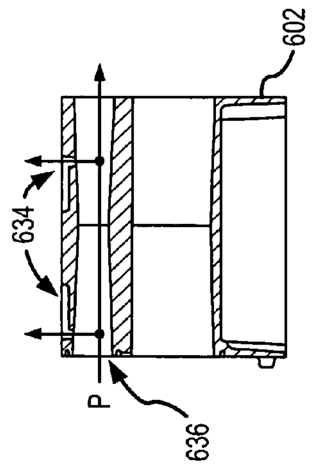
FIG. 6*d* is sectional view of double sub-base 602 from section AA in FIG. 6*b*.
Figure 6E:
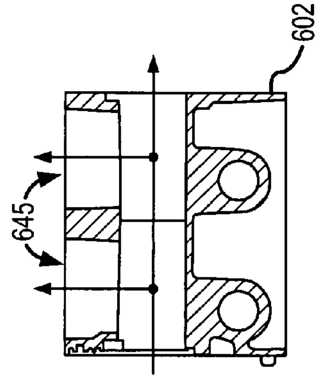
FIG. 6*e* is sectional view of double sub-base 602 from section BB in FIG. 6*b*.
Figure 6F:
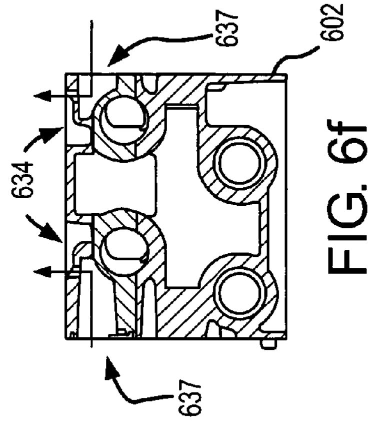
FIG. 6*f* is sectional view of double sub-base 602 from section CC in FIG. 6*b*.

FIG. 6*b* is side view of double sub-base 602 in an example embodiment of the invention. FIG. 6*c* is a top view of double sub-base 602 in an example embodiment of the invention. FIG. 6*d* is sectional view of double sub-base 602 from section AA in FIG. 6*b*. FIG. 6*e* is sectional view of double sub-base 602 from section BB in FIG. 6*b*. FIG. 6*f* is sectional view of double sub-base 602 from section CC in FIG. 6*b*. FIG. 6*d* shows a sectional view of the pilot air side opening 636 formed near the back of double sub-base 602. Pilot air side opening 636 goes all the way through double sub-base 602. When double sub-base 602 is attached to an end plate (as shown in FIG. 4) the pilot air port aligns with, and couples to, the pilot air side opening 636. Pilot air side opening 636 forms a pilot air supply system that is coupled between each of the sub-bases attached to the valve island. Pressurized gas (as shown by the arrow P) is fed from the pilot air port in the end plate, through pilot air side opening 636, to adjacent parts coupled to the right side of double sub-base 602. Pilot air side opening 636 is coupled to the two pilot air openings 634 on the top side, near the back, of double sub-base 602, allowing the pressurized gas into pilot air openings 634.

Pilot air channel 638 couples pilot air side opening 636 with front pilot air side opening 637. A mating part attached to the left side of double sub-base 602 would cover pilot air channel 638, forming a pilot air passageway from the back of double sub-base 602 to the front of double sub-base 602. FIG. 6*f* is a sectional view of double sub-base 602 through front pilot air side opening 637. Front pilot air side opening 637 formed in the left side of double sub-base 602 is coupled to the pilot air opening formed on the top left side of double sub-base 602. Front pilot air side opening 637 formed in the right side of double sub-base 602 is coupled to the pilot air opening formed on the top right side of double sub-base 602. Pilot air side opening 637 formed in the left side of double sub-base 602 is fed through pilot air channel 638 formed in the left side of double sub-base 602. Pilot air side opening 637 formed in the right side of double sub-base 602 is fed by a pilot air channel formed in a mating part attached to the right side of double sub-base 602. The pilot air channel may be formed on the sub-base, the mating part, or both the sub-base and the mating part. The mating part may be another sub-base, or end plate, or the like.

In another example embodiment of the invention, the front pilot air side opening may go through the sub-base to form a pilot air supply system that couples to the different sub-bases attached to the valve island.

Figure 7:
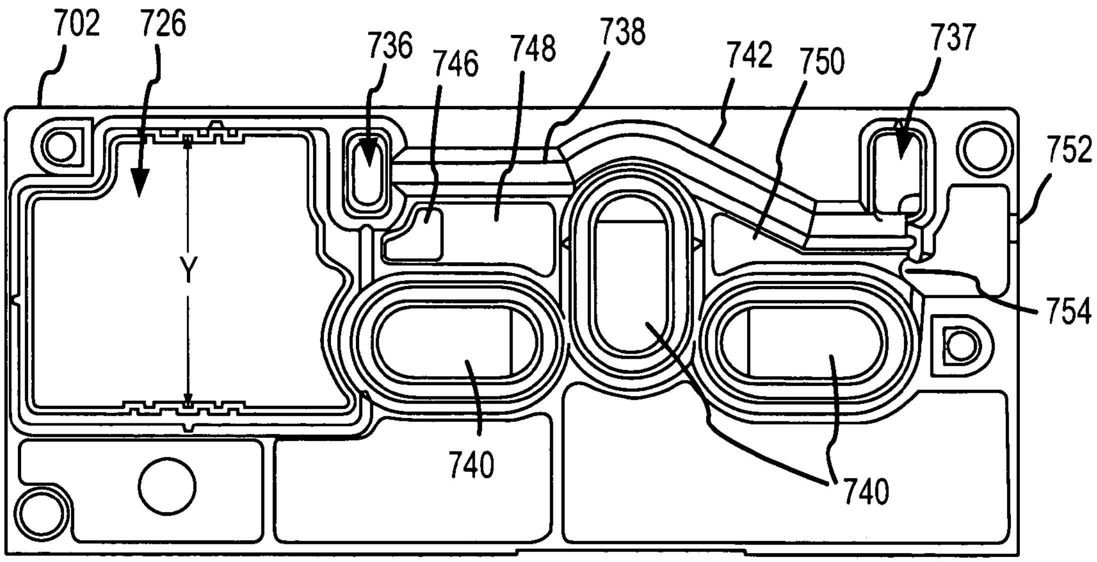
FIG. 7 is a side view of sub-base 702 in an example embodiment of the invention.

FIG. 7 is a side view of a sub-base 702 in an example embodiment of the invention. Sub-base 702 comprises wireway 726, main gas passageways 740, pilot air side openings 736, pilot air side opening 737, pilot air channel 738, side vent opening 746, non-active area 748, non-active area 750, vent channel 752, and gasket groove 742. The three main gas passageways 740 and the pilot air passageway are collectively called the active gas passageways. Pilot air channel 738 runs between and connects the two pilot air side openings 736 and 737. A sealing surface, formed essentially in one plane, surrounds the active gas passageways and the wireway 726. The sealing surface may optionally use a gasket or O-ring to help form the seal. In one example embodiment of the invention gasket groove 742 is formed into the sealing surface and surrounds the two side air opening 736 and 737 and the pilot air channel 738. Gasket groove 742 also surrounds the three main air passageways 740 and wireway 726. The gasket (shown in FIG. 6*a*) that fits into gasket groove 742 essentially surrounds all the active gas passageways and provides a seal between each of the active gas passageways. The gasket also surrounds wireway 726 and provides an environmental seal for the wireway. The gasket groove can be formed in the sub-base (as shown) or into the mating part, or in both the sub-base and the mating part.

In operation, the side of sub-base 702 that contains the pilot air channel is attached to the opposite side of another valve island component. The side face of the component is configured to cover the pilot air channel 738 in the sub-base. The side face of the component seals against the sealing surface, or the gasket, surrounding the two pilot air side openings 736 and 737 and the pilot air channel 738 and forms a pilot air passageway between the sub-bases and the component. The mating component may be another sub-base, an end plate, or the like.

The active gas passageways typically contain pressurized gas. Areas on the sub-base are exposed to the pressurized gas. As the surface area that is exposed to pressurized gas increases, the force required to hold the sub-base onto the mating part increases. Reducing the area exposed to the pressurized gas decreases the required force. Areas that are not intentionally exposed to pressure may be exposed to pressure due to leaks in the sealing surface or sealing gasket. In this patent, areas not intentionally exposed to pressure will be called non-active areas. Some non-active areas are surrounded by the sealing surfaces or sealing gaskets, for example non-active areas 748 and 750. Pressurized gas leaking into these areas would increase the amount of force required to hold the sub-base onto the mating part. In one example embodiment of the invention these non-active areas are vented to the outside air to prevent the buildup of pressure in the non-active areas. Side vent opening 746 is formed into non-active area 748 and couples to a top vent opening formed in the top of sub-base 702 preventing pressure buildup in non-active area 748. Vent gap 754 forms an opening underneath a gasket installed in gasket groove 742. Vent gap 754 couples non-active area 750 to vent channel 752. Vent channel 752 is coupled to the outside air on the front of the sub-base and prevents pressure buildup in non-active area 750. In one example embodiment of the invention, the non-active areas are recessed below the level of the sealing surface such that essentially all of the non-active surface area is coupled to the vents. The recessed surfaces can be formed on the sub-base, the mating part, or both the sub-base and the mating part.

Figure 8:
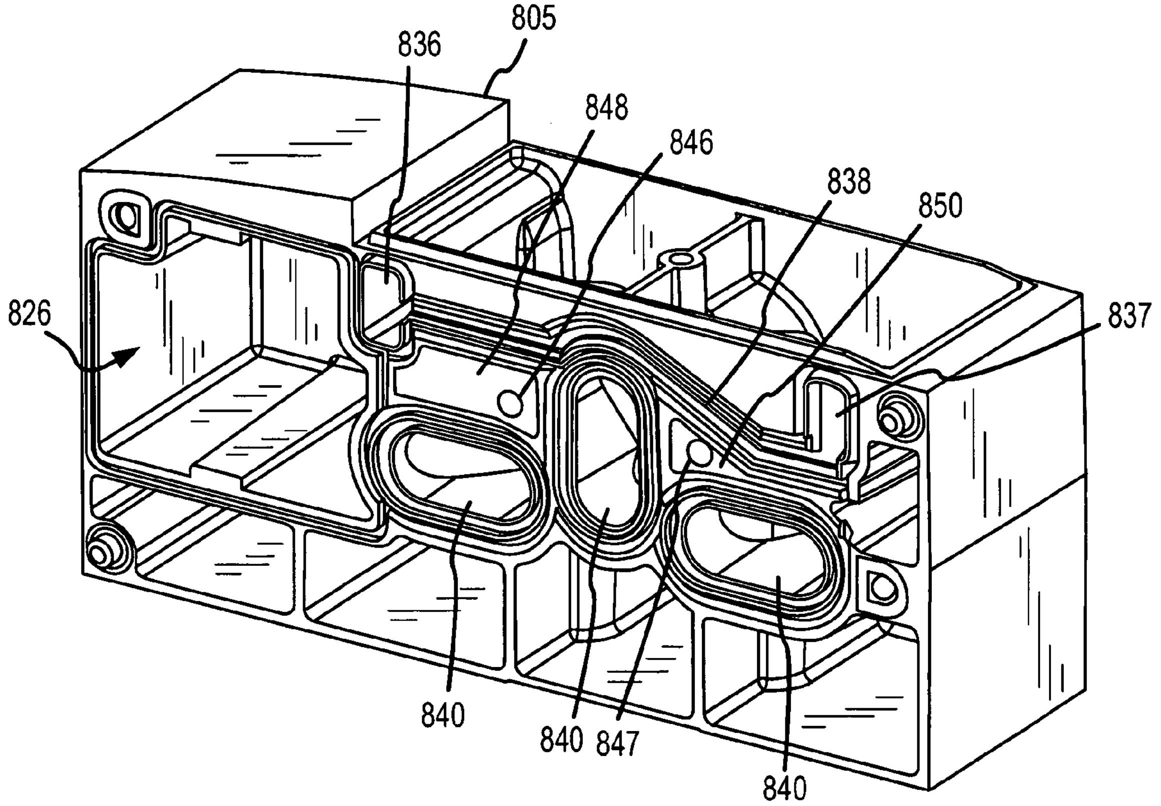
FIG. 8 is an isometric view of an end plate 805 in an example embodiment of the invention.

In one example embodiment of the invention, the non-active areas on the end plates can also be vented. FIG. 8 is an isometric view of an end plate 804 in an example embodiment of the invention. End plate 805 comprises main air passageways 840, gasket groove 842, non-active areas 848 and 850, pilot air side openings 836 and 837, pilot air channel 838, and side vent openings 846 and 847. Gasket groove 842 surrounds the two pilot air side openings 836 and 837 and the pilot air channel 838. Gasket groove 842 also surrounds the three main air passageways 840 and wireway 826. The three main air passageways 840 are sealed by the end plate. The pilot air side openings and pilot air channel 838 will be used when the end plate is attached to a double station sub-base. Non-active area 848 is surrounded by gasket groove 842. Side vent 846 couples non-active area 848 to outside air and prevents the buildup or containment of pressure inside non-active area 848. Non-active area 850 is also surrounded by gasket groove 842. Side vent 847 couples non-active area 850 to outside air and prevents the buildup or containment of pressure inside non-active area 850. In one example embodiment of the invention, the non-active areas are recessed below the level of the sealing surface such that essentially all of the non-active surface area is coupled to the vents. The gasket groove and the recessed areas can be formed on either side, or both sides, of the interface between the two parts.

The invention is not limited to venting non-active areas between two sub-bases or a sub-base and an end plate. Other components of a valve island may also have non-active areas vented, for example, blanking plates, sandwich regulators, sandwich flow control devices, accessories, intermediate supply and exhaust modules (ISEM), and the like.

Figure 1:
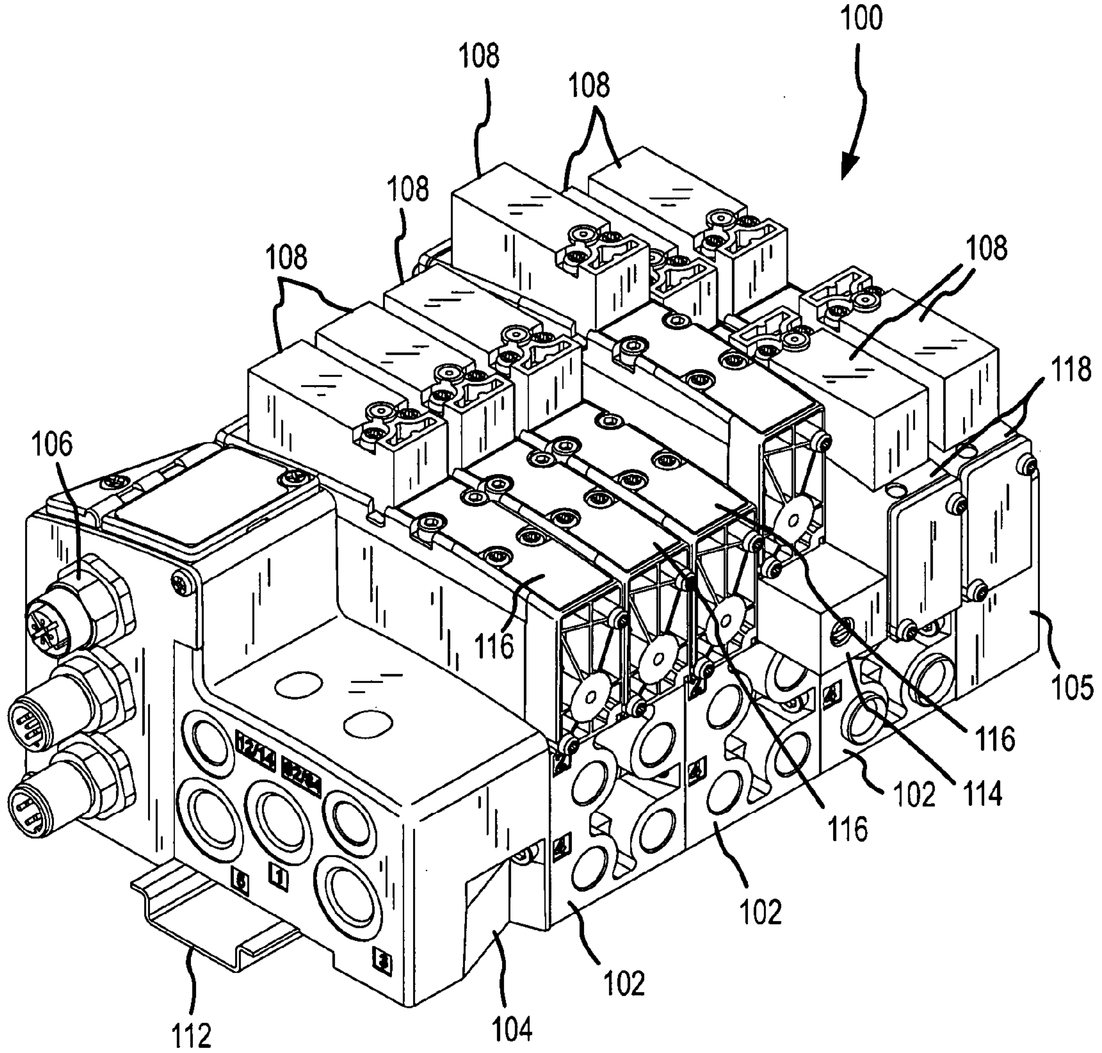
FIG. 1 PRIOR ART
FIG. 1 is an isometric view of the front side of an integrated manifold assembly 100.
Figure 9:
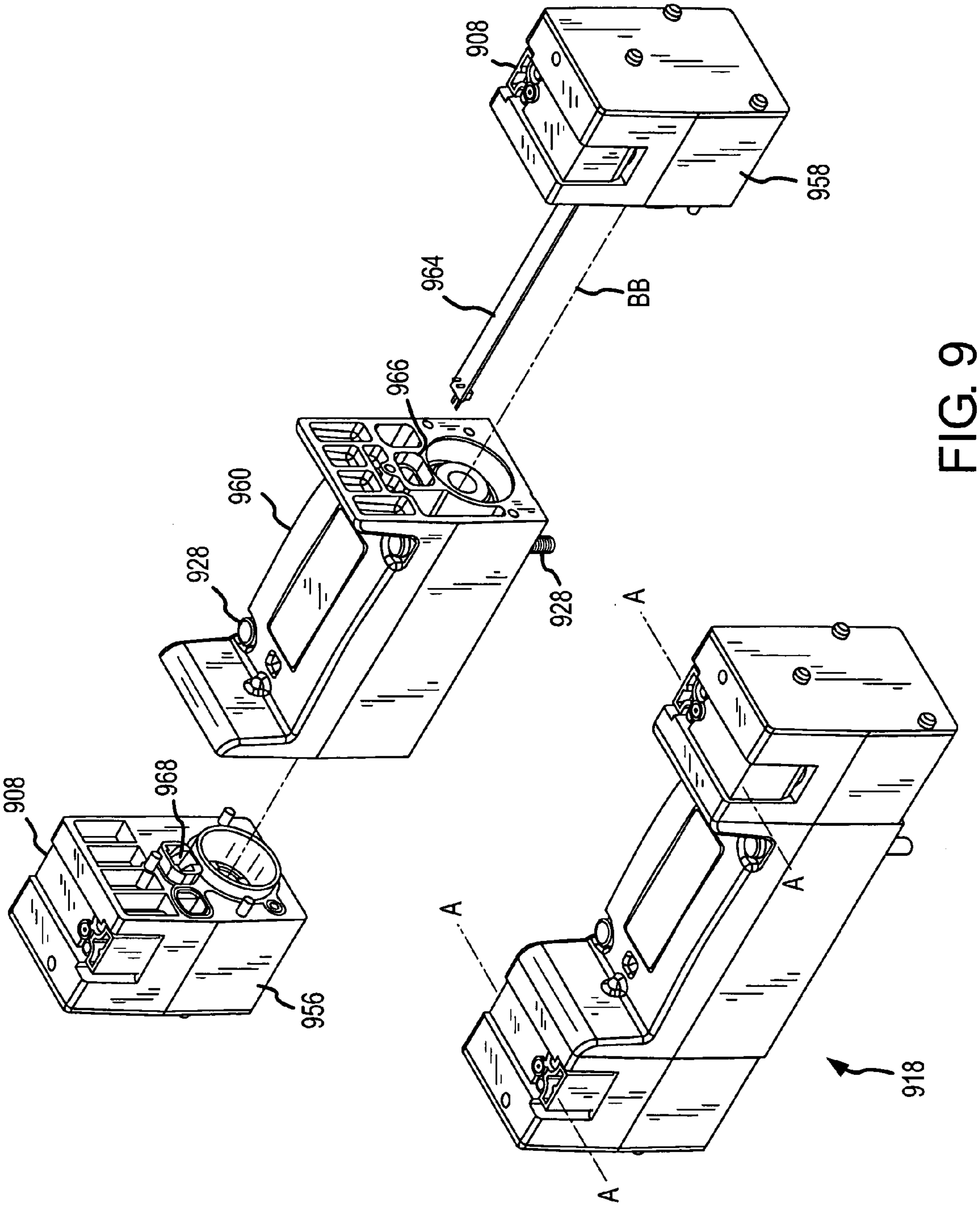
FIG. 9 is an exploded isometric view of a double solenoid valve 918 in an example embodiment of the invention.

FIG. 9 is an exploded isometric view of a double solenoid valve 918 in an example embodiment of the invention. Double solenoid valve 918 comprises a single solenoid operator 956, a valve body 960, a double solenoid operator 958 a double solenoid PC board 964, two screws 928 and two solenoids 908. In prior art solenoid valves, the long axis of the solenoid is aligned with the long axis of the valve body (see FIGS. 1 and 2). Double solenoid valve 918 has a long axis BB. The two solenoids 908 have long axis AA. In one example embodiment of the invention, the long axis AA of the solenoids 908 on the double solenoid valve 918 have been rotated 90 degrees with respect to the long axis BB of the double solenoid valve 918.

Double solenoid valve 918 can be converted into a single solenoid valve by replacing double solenoid operator 958 with a return spring (not shown). When double solenoid operator 958 and single solenoid operator 956 are assembled onto either side of valve body 960, double solenoid PC board 964 extends through valve body PC board opening 966 and through single solenoid PC board opening 968, and mates with or couples to a single solenoid PC board (not shown) inside the single solenoid operator 956. In operation double solenoid valve 918 is attached to a sub-base (not shown) using screws 928.

Figure 10:
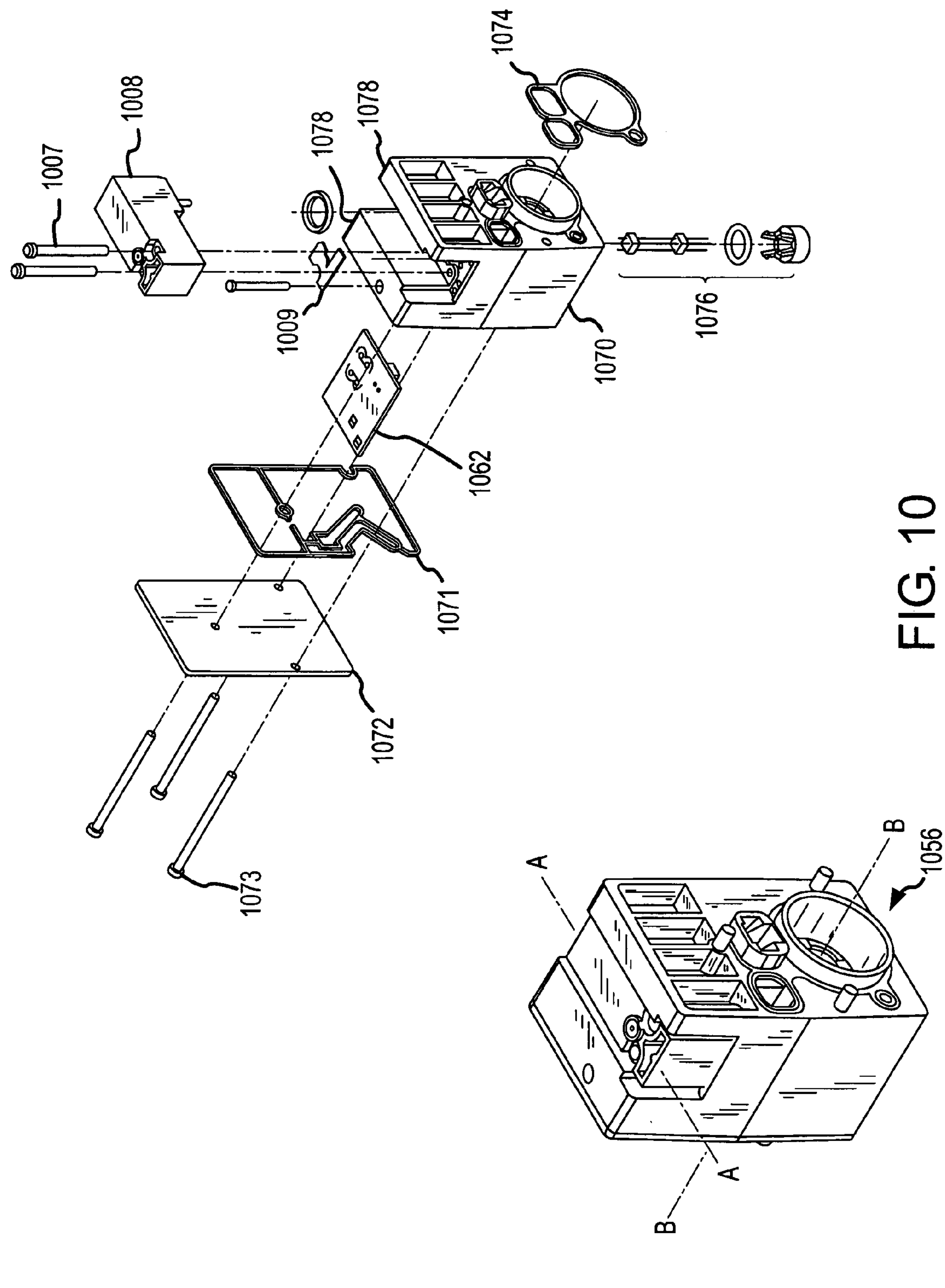
FIG. 10 is an isometric exploded view of single solenoid operator 1056 in one example embodiment of the invention.

FIG. 10 is an isometric exploded view of single solenoid operator 1056 in one example embodiment of the invention. Single solenoid operator 1056 comprises an operator body 1070, a single solenoid PC board 1062, a cover plate 1072, a cover plate gasket 1071, cover plate screws 1073, an electrical extension 1076, an operator gasket 1074, a solenoid 1008, a solenoid gasket 1009, and solenoid screws 1007. Solenoid 1008 has a long axis AA. Operator body 1070 has a long axis BB that corresponds to the long axis of a solenoid valve (not shown). The long axis of the solenoid 1008 is perpendicular to the long axis of the operator body 1070. Operator body 1070 has a solenoid mount formed into the top surface of the operator body 1070. Solenoid mount includes two side walls or flanges 1078 that extend on both sides of the solenoid mount forming a slot into which the solenoid 1008 is mounted. The flanges 1078 protect the solenoid 1008 from damage. The flanges may extend part way up to the top of the solenoid, they may be flush with the top of the solenoid, or they may extend above the top of the solenoid. FIG. 10 shows the flanges 1078 extending above the top of solenoid 1008. The flanges are optional and are not required when mounting the long axis of the solenoid perpendicular to the long axis of the operator body. The overall length of the operator may be shortened by mounting the solenoid 90 degrees with respect to the operator length.

Figure 11:
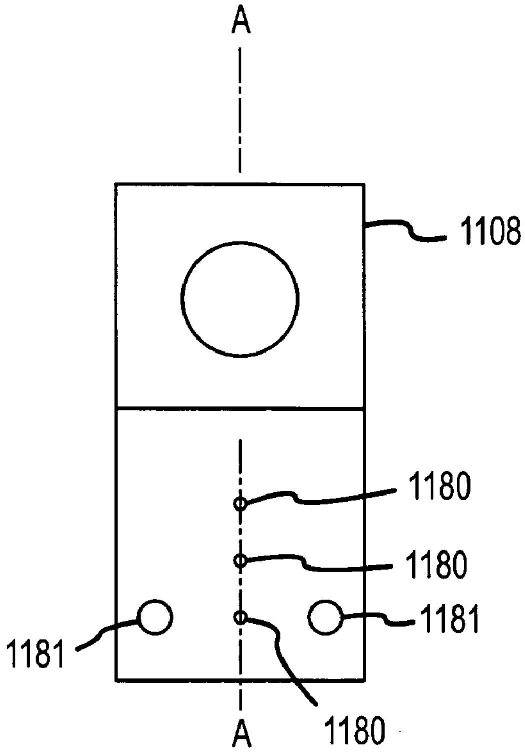
FIG.11 PRIOR ART
FIG. 11 is a bottom view of a typical prior art solenoid 1108.
Figure 12:
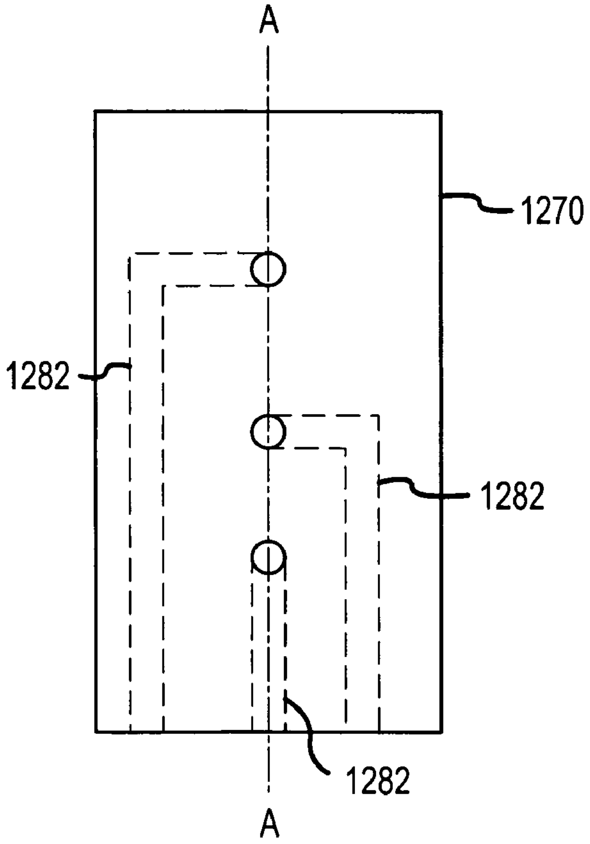
FIG. 12 is a top view of a prior art operator 1270.

FIG. 11 is a bottom view of a typical prior art solenoid 1108. Solenoid has two screw holes 1181 used to attach the solenoid to an operator body. Solenoid 1108 has a long axis AA. Solenoid 1108 has a number of pneumatic control ports or openings 1180 forming a line parallel to long axis AA. Gas is forced through pneumatic control ports 1180 into passageways in an operator body during operation of the solenoid valve. When the long axis AA of the solenoid 1108 is aligned with the long axis of the operator body, the passageways in the operator body that mate to the pneumatic control ports 1180 may be difficult to route. FIG. 12 is a top view of a prior art operator 1270. Operator 1270 has long axis AA. Operator 1270 is configured to mount a solenoid with the long axis of the solenoid parallel with the long axis AA of the operator. The openings to the passageways 1282 form a line parallel with the long axis AA. The passageways are difficult to manufacture due to the right angle bends required to align the passageways with the end of the operator.

Figure 13:
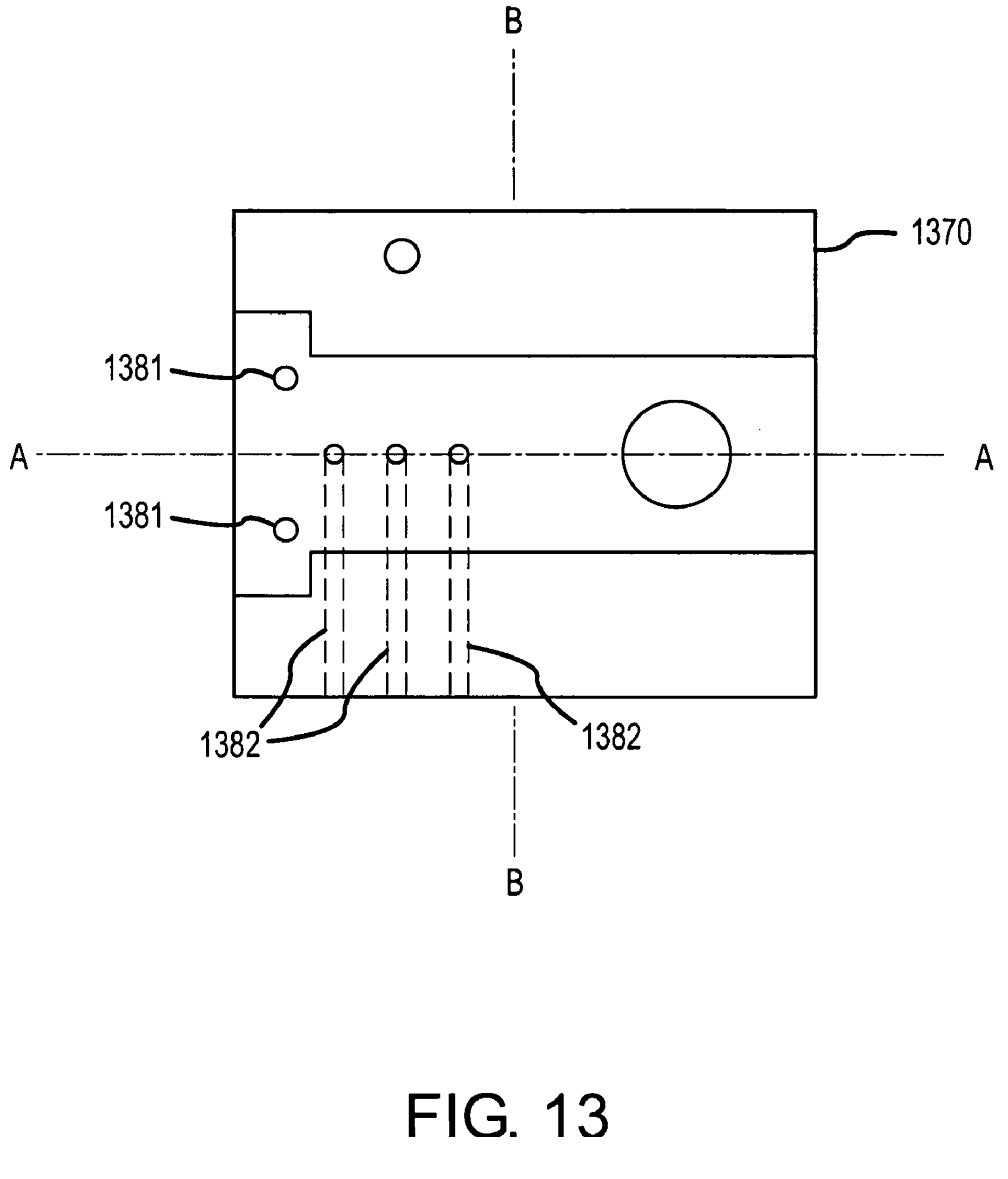
FIG. 13 is a top view of an operator 1370 in an example embodiment of the invention.

FIG. 13 is a top view of an operator 1370 in an example embodiment of the invention. Operator 1370 has an axis BB that corresponds to the long axis of a solenoid valve. Operator 1370 has a solenoid mount with a number of passageways 1382 that mate with the control ports of a solenoid mounted onto operator 1370. The openings of the passageways 1382 form a line along axis AA. Axis AA is perpendicular to axis BB. The passageways 1382 can be formed easier than passageways 1282. In some embodiments of the invention, some of the passageways 1382 may exit from operator 1370 on different faces.

Figure 14:
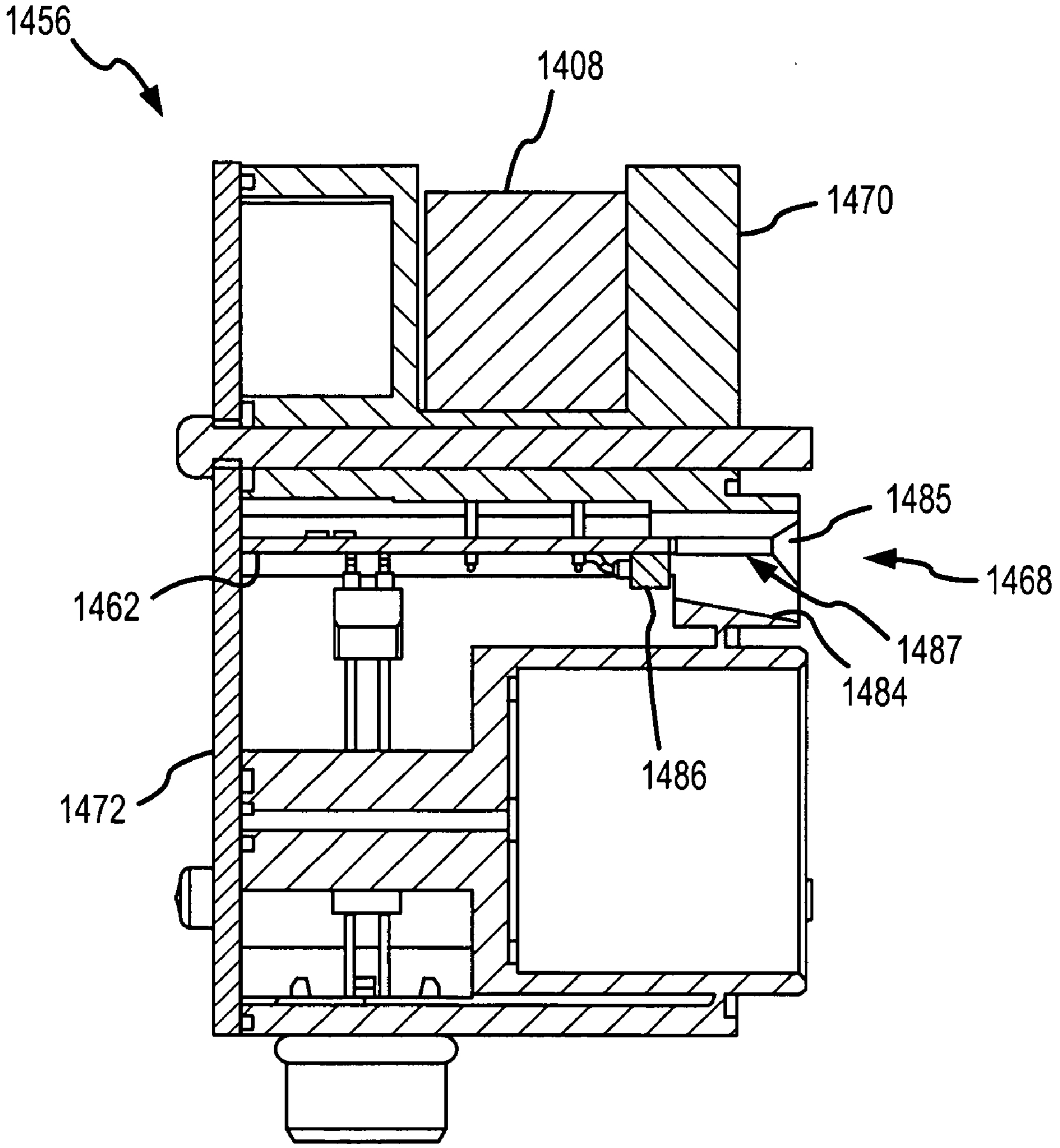
FIG. 14 is a sectional view of a single solenoid operator 1456 in an example embodiment of the invention.

FIG. 14 is a sectional view of a single solenoid operator 1456 in an example embodiment of the invention. Single solenoid operator 1456 comprises operator body 1470, solenoid 1408, cover plate 1472, and single solenoid PC board 1462. Single solenoid PC board 1462 is mounted inside a cavity formed into operator body 1470. Single solenoid PC board 1462 has a connector 1486 mounted on the bottom side of single solenoid PC board 1462. In another embodiment, the connector 1486 could be mounted on the top side of the PC board 1462. The connector 1486 is aligned with a single solenoid PC board opening 1468 in the front of the operator body 1470. In one example embodiment of the invention single solenoid PC board opening 1468 has a bottom ramp 1484, a side ramp 1485, and an alignment slot 1487, configured to guide the connector on a double solenoid PC board (not shown) into connector 1486 when the double solenoid PC board is inserted into the single solenoid PC board opening 1468. In other embodiments the single solenoid PC board opening 1468 may not use a side ramp or may not use an alignment slot.

Figure 15:
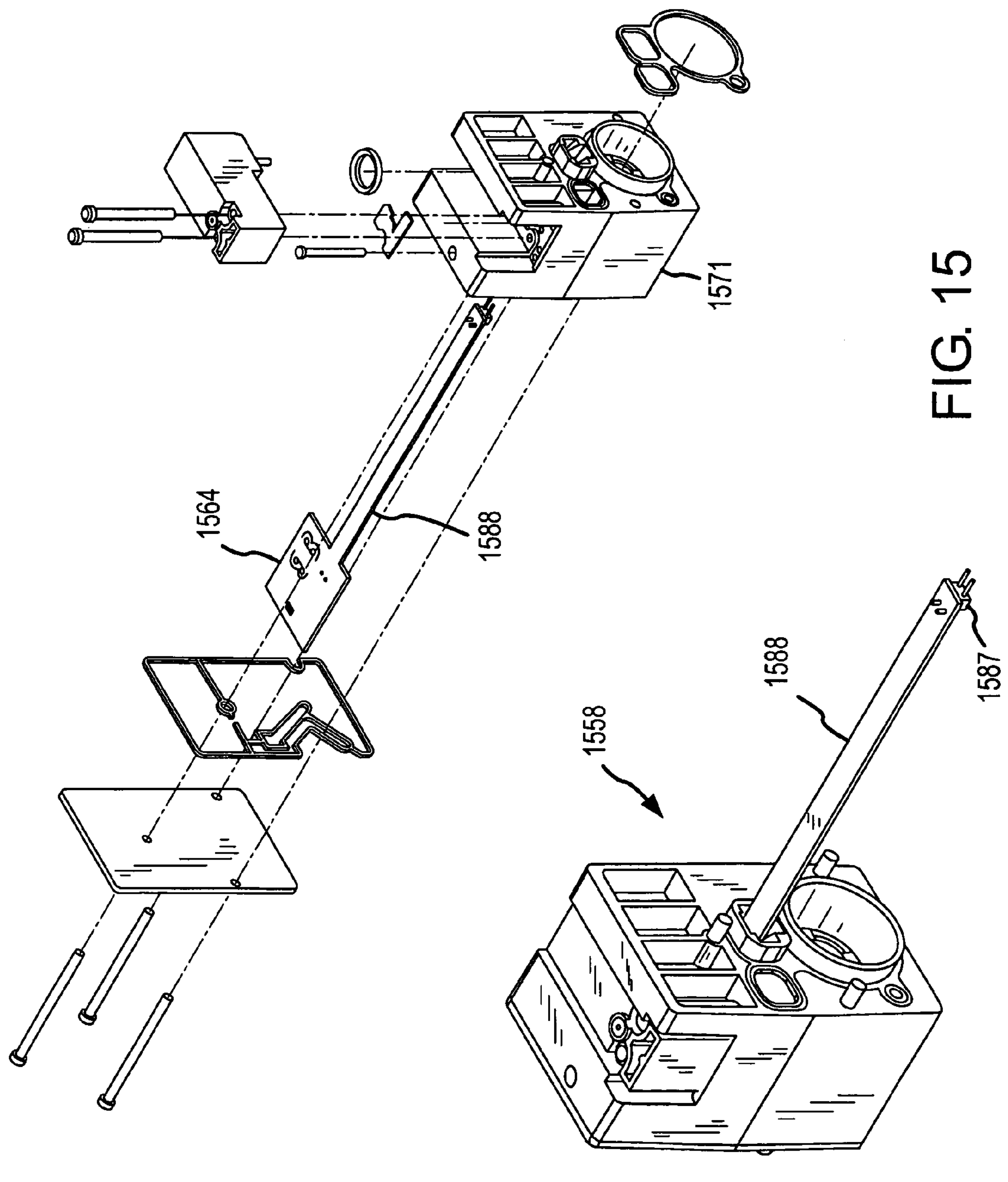
FIG. 15 is an exploded isometric view of a double solenoid operator 1558 in an example embodiment of the invention.

FIG. 15 is an exploded isometric view of a double solenoid operator 1558 in an example embodiment of the invention. Double solenoid operator 1558 has an operator body 1571 and a double solenoid PC board 1564. Double solenoid PC board 1564 has a main rectangular section and a long narrow section 1588 extending from the main section. The main rectangular section is configured to mount inside the operator body with the long narrow section 1588 sticking out through the front of the operator body 1571. A connector 1587 is attached to the end of the long narrow section 1588 and configured to connect to the connector 1486 on a single solenoid PC board 1462 when both the single solenoid operator and the double solenoid operator are attached to both ends of a valve body (see FIG. 9). In past valve islands the long narrow section was typically a separate PC board or wires with connectors on both ends. By integrating the long narrow section 1588 as part of the PC board, three parts where eliminated (one connector pair and a separate long thin PC board or wire harness).

Figure 16:
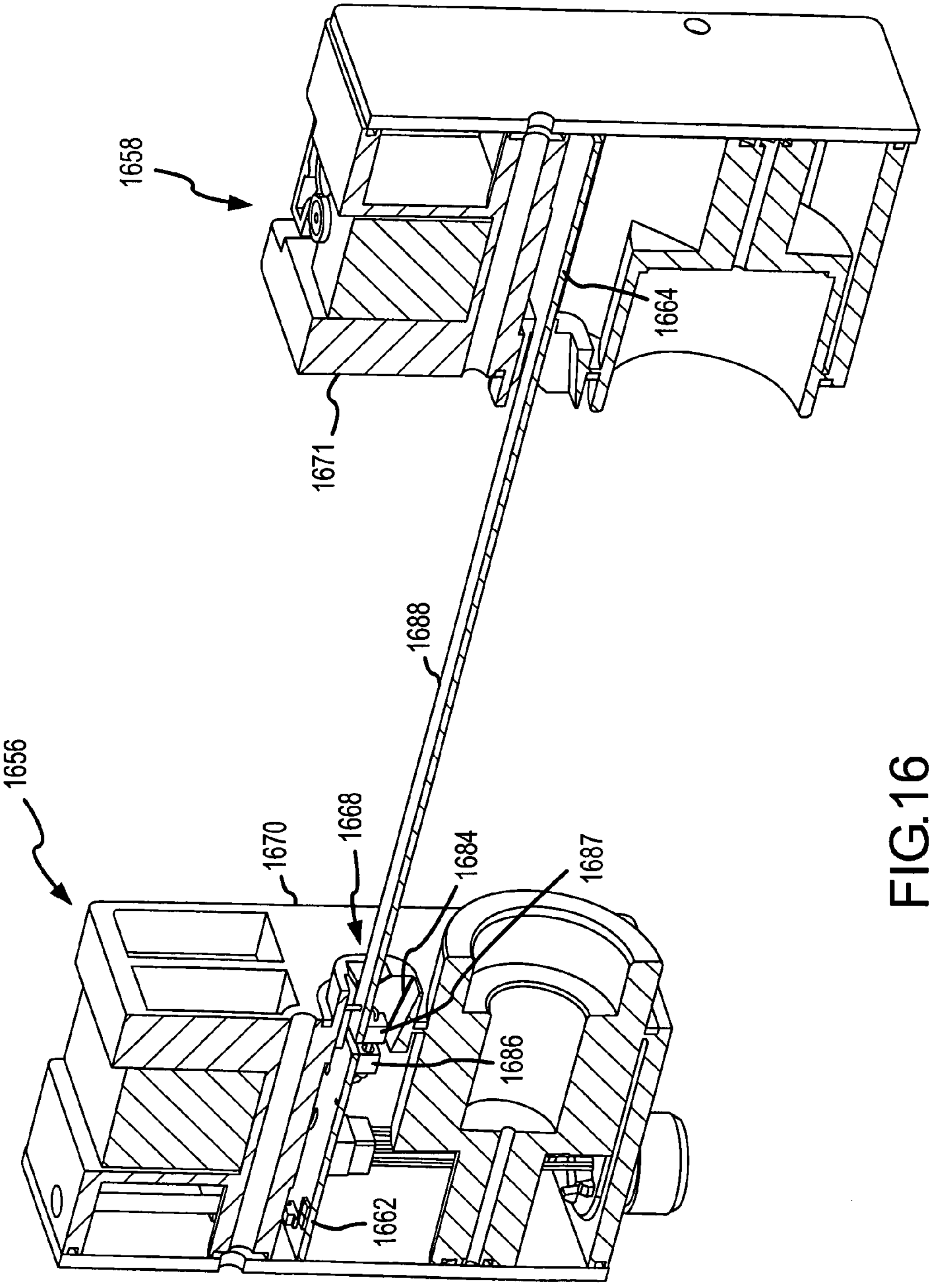
FIG. 16 is an isometric sectional view of a double solenoid operator 1658 coupled to a single solenoid operator 1656 in an example embodiment of the invention.

FIG. 16 is an isometric sectional view of a double solenoid operator 1658 coupled to a single solenoid operator 1656 in an example embodiment of the invention. Single solenoid operator 1656 has single solenoid PC board 1662 installed inside operator body 1670. Connector 1686 is installed on the bottom of single solenoid PC board 1662. In another embodiment, the connector could be mounted on the top of the PC board. Connector 1686 on single solenoid PC board 1662 is aligned with PC board opening 1668 in the front face of single solenoid operator 1656. Double solenoid operator 1658 has double solenoid PC board mounted inside operator body 1671. A narrow section 1688 of double solenoid PC board 1664 extends out from the front face of double solenoid operator 1658. The end or tip of the narrow section 1688 has connector 1687 attached and is inserted into PC board opening 1668 in the front face of single solenoid operator 1656 where the two connector 1686 and 1687 are joined together. Ramp 1684 is formed on the bottom side of PC board opening 1668 and guides the tip of narrow section 1688 as it is inserted into the single solenoid operator 1656. In another embodiment, ramp 1684 may be formed into the top of PC board opening 1668. A ramp may also be formed into one or both sides of PC board opening 1668 to help align the narrow section 1688 of PC board opening 1668 as it is inserted into the PC board opening 1668 and joined to the mating connector 1686. The order for installing the two PC boards is unimportant. When the double solenoid PC board is installed into the valve before the single solenoid PC board, the ramp 1684 may be used to guide the connector 1687 on the tip of the double solenoid PC board 1688 to the correct position. Once the connector on the double solenoid PC board is in position, the single solenoid PC board can be installed and mated with or coupled to the double solenoid PC board.

Figure 3:
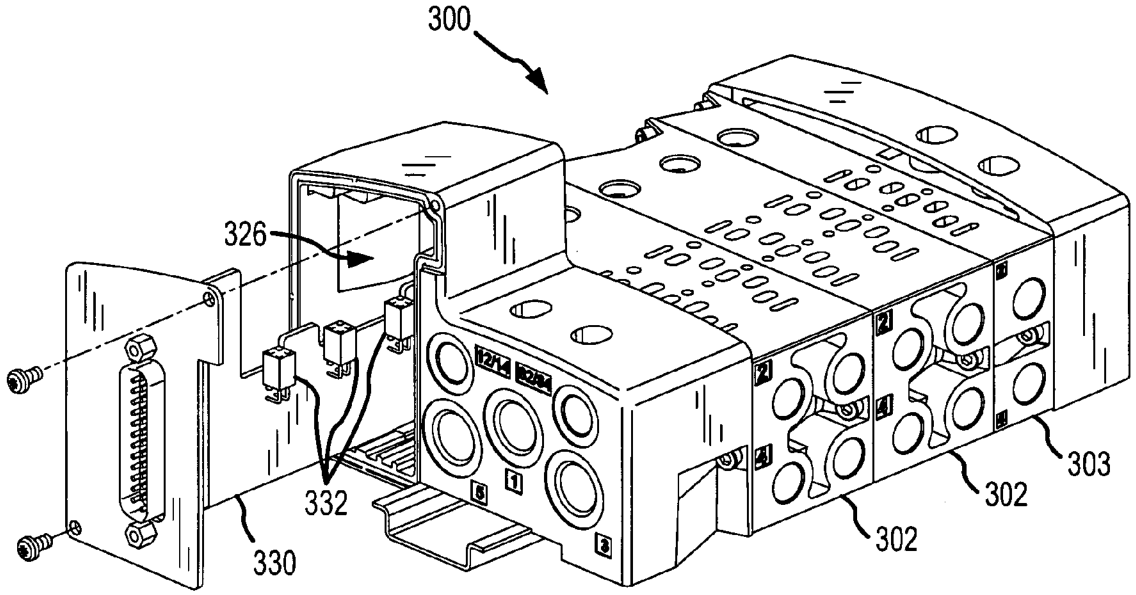
FIG. 3 PRIOR ART
FIG. 3 is an isometric view of main PC board 330 being inserted into the electronic raceway 326 of a valve island 300.

FIG. 4 is an isometric view of valve island 400 in one example embodiment of the invention. Valve island 400 is a 3 station assembly and comprises a double sub-base 402, a single sub-base 403, end plate 405, communication end plate 404, two single solenoid valves 416, a double solenoid valve 418, a main PC board 430, and a plurality of solenoids 408. Main PC board 430 is attached to endplate 404 and extends through double sub-base 402 and single sub-base 403 (also see FIG. 3). The single solenoid PC boards mounted inside the single solenoid operators connect to the main PC board 430 using electrical extensions 1076 (see FIG. 10) that mate with and couple to connectors 332 (see FIG. 3) mounted on main PC board 430. Valve islands can be expanded by adding one of more add-on stations. The add-on stations may be either single or double add-on-stations. To expand a valve island, the endplate is removed, the add-on station is coupled to the last sub-base, and the endplate is re-attached to the add-on station.

Figure 2:
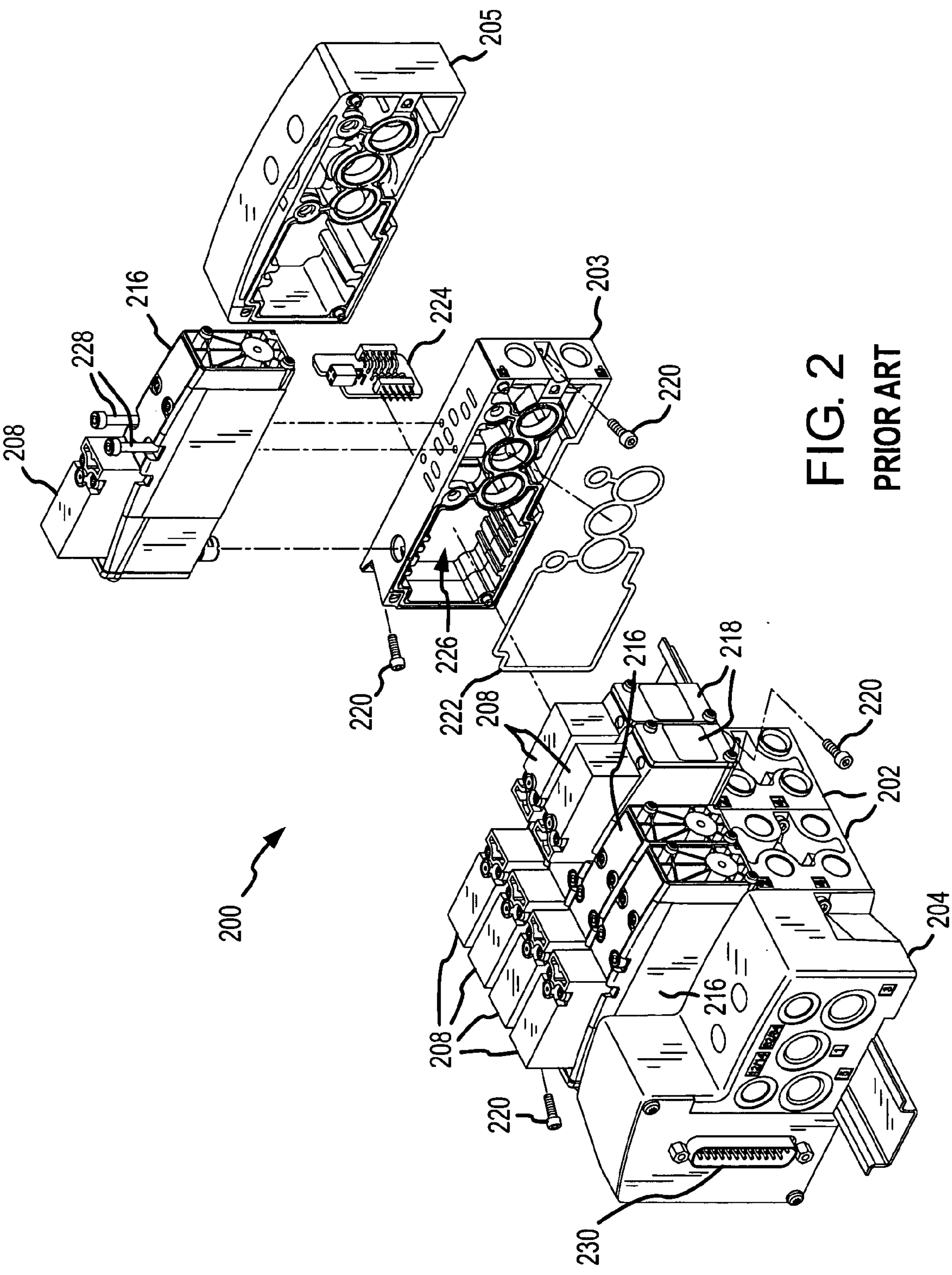
FIG. 2 PRIOR ART
FIG. 2 is an exploded isometric view of the front of an integrated manifold assembly 200.

FIG. 2 is a partially exploded view of a typical valve island being expanded with a single solenoid valve. Valve island 200 has a plurality of sub-bases 202, two end plates 204 and 205, a single add on station 203, a plurality of single solenoid valves 216, two double solenoid valves 218, screws 220, gasket 222, single expansion PC board 224, and a plurality of solenoids 208. Screws 220 are used to couple the sub-bases together and attach the sub-bases to the end plates 204 and 205. Gasket 222 helps form a seal between the sub-bases 202 and the single add on station 203. Single expansion PC board 224 is installed into electronic raceway 226 of the sub-base of single add-on station 203 and is used to control the valve attached to the single add on station 203. Single expansion PC board 224 connects to the end of the main PC board 230 that is inside the wireway of the two sub-bases 202.

When single add-on station 203 needs to be serviced or replaced, end plate 205 is removed and the single add-on station 203 is detached from the end sub-base 202. In current valve islands, when single add-on sub-base 203 is removed from the end sub-base 202, the single add-on PC board 224 may pull out of wireway 226 and remain attached to the main PC board 230. In one example embodiment of the current invention, the single add-on and double add-on PC boards have a feature that holds the PC boards into the wireway of the add on station and prevents the PC boards from being pulled free from the add on station when the add-on station is removed from the valve island.

Figure 17:
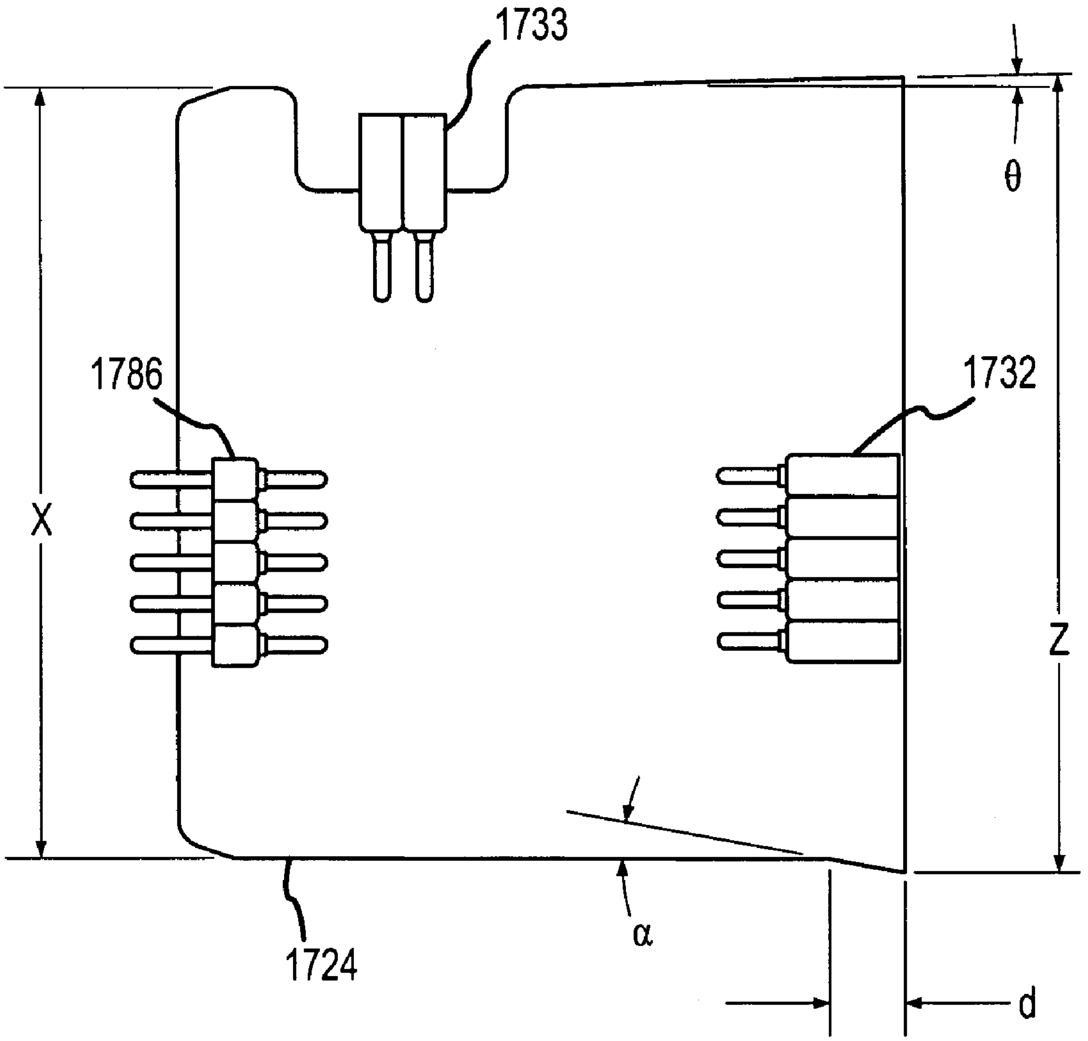
FIG. 17 is a front view of single expansion PC board 1724 in an example embodiment of the invention.

FIG. 17 is a front view of single expansion PC board 1724 in an example embodiment of the invention. Single expansion PC board 1724 would be installed into the wireway of a single sub-base (see FIG. 7). Single expansion PC board 1724 has three connectors (1786, 1733, and 1732) mounted on different edges of the PC board. Connector 1786 is configured to mate with and couple to a connector on the end of a main PC board or into connector 1732 of another add-on station already installed into a valve island. Connector 1733 is configured to mate with and couple to an electrical extension 1076 attached to a single solenoid PC board 1062 (see FIG. 10). Single expansion PC board 1724 has a board height X which is configured to fit inside the wireway height Y of a sub-base 702 (see FIG. 7). In some embodiments of the invention, board height X may include the height from angle θ that matches a draft angle in wireway 726. In some embodiments of the invention, wireway 726 may have slots formed into the top and/or bottom of the wireway to help align and guide the single expansion add-on board into the wireway 726. Single expansion PC board 1724 has a feature on the bottom edge of the board that prevents the PC board from being pulled through wireway 726 as the sub-base is being removed from a valve island. The feature secures or captures the PC board in the wireway from a force applied from essentially only one direction. The feature acts like a check valve in that it prevents relative motion in only one direction. In one example embodiment of the invention, the feature is a triangular projection of the PC board extending from the bottom of the main section of the PC board beyond height X. The triangular section is length D long and has an angle alpha (α). The total height of the PC board, including the triangular section, is height Z, which is larger than wireway height Y. As sub-base 702 is being removed from a valve island, the triangular section will wedge into wireway 726 and prevent single expansion PC board 1724 from being pulled from wireway 726. The locking feature may also be known as an interference feature, a securing feature, or the like. In one example embodiment of the invention, length D is 4.8 mm and angle α is 11 degrees.

FIG. 17 shows the locking feature as a triangular section on the bottom of single expansion PC board 1724, but the invention is not limited to a single triangular shape on the bottom of the PC board. Any shape that prevents the PC board from being pulled from the wireway may be used. The shape can be on the top side, bottom side or both sides of the PC board. Some examples include: two triangular sections, one on the top and one on the bottom of the PC board, a curve that extends the length of the PC board, a square piece of the PC board that extends beyond the nominal height of the PC board, or the like. The locking feature can be added to both a single expansion PC board and a double expansion PC board.

We claim:

1. An apparatus, comprising:

a single solenoid PC board installed inside a single solenoid operator;

the single solenoid operator attached to a first end of a valve body;

a double solenoid operator attached to a second end of the valve body;

a double solenoid PC board installed in the double solenoid operator where the double solenoid PC board has a long narrow section extending from a main section of the double solenoid PC board;

the long narrow section of the double solenoid PC board extending out from the double solenoid operator and into the valve body, the long narrow section extending through the valve body into the single solenoid operator, the long narrow section coupled to the single solenoid PC board installed inside the single solenoid operator.

2. The apparatus of claim 1 where the long narrow section of the PC board is essentially centered in the middle of a face of the main section.

3. The apparatus of claim 1 where the connector is on a bottom side of the double solenoid PC board.

4. The apparatus of claim 1 where the connector is on a top side of the double solenoid PC board.

* * * * *